US008510617B2

(12) United States Patent
Naka

(10) Patent No.: US 8,510,617 B2
(45) Date of Patent: Aug. 13, 2013

(54) RECORDING APPARATUS FOR PERFORMING IMAGE PROCESSING FOR RECORDING ON A RECORDING MEDIUM BY RELATIVE MOVEMENT

(75) Inventor: Hironori Naka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 279 days.

(21) Appl. No.: 12/958,245

(22) Filed: Dec. 1, 2010

(65) Prior Publication Data

US 2011/0307763 A1 Dec. 15, 2011

(30) Foreign Application Priority Data

Jun. 9, 2010 (JP) ................................. 2010-132129

(51) Int. Cl.
*H03M 13/00* (2006.01)

(52) U.S. Cl.
USPC ............................. 714/746; 358/1.9; 382/289

(58) Field of Classification Search
USPC ........................... 714/746; 358/1.9; 382/289
See application file for complete search history.

(56) References Cited

U.S. PATENT DOCUMENTS

| | | | | |
|---|---|---|---|---|
| 6,025,929 | A | 2/2000 | Nakajima | |
| 6,415,064 | B1 * | 7/2002 | Oh | 382/289 |
| 6,665,452 | B1 * | 12/2003 | Takemoto et al. | 382/289 |
| 6,694,052 | B1 * | 2/2004 | Matama | 382/169 |
| 6,757,075 | B1 * | 6/2004 | Takemoto | 358/1.7 |
| 6,816,624 | B1 * | 11/2004 | Ebisawa et al. | 382/275 |
| 7,002,701 | B1 * | 2/2006 | Nakayasu et al. | 358/1.12 |
| 7,292,252 | B2 * | 11/2007 | Matsuda | 345/589 |
| 7,431,210 | B2 * | 10/2008 | Kikuchi et al. | 235/438 |
| 7,499,193 | B2 * | 3/2009 | Nishikawa | 358/1.9 |
| 7,661,787 | B2 * | 2/2010 | Hoshiyama et al. | 347/19 |
| 8,160,393 | B2 * | 4/2012 | Honsinger et al. | 382/289 |
| 8,320,024 | B2 * | 11/2012 | Kawai et al. | 358/3.26 |

FOREIGN PATENT DOCUMENTS

JP 10-13674 A 1/1998

OTHER PUBLICATIONS

U.S. Appl. No. 13/084,387, filed Apr. 11, 2011, Masaki Maeno.
U.S. Appl. No. 12/965,774, filed Dec. 10, 2010, Ryosuke Sato.
U.S. Appl. No. 12/964,681, filed Dec. 9, 2010, Ryosuke Sato.
U.S. Appl. No. 12/945,598, filed Nov. 12, 2010, Koichiro Kawaguchi.
U.S. Appl. No. 12/941,856, filed Nov. 8, 2010, Yosui Naito.
U.S. Appl. No. 12/834,651, filed Jul. 12, 2010, Tetsuhiro Nitta.
U.S. Appl. No. 12/825,071, filed Jun. 28, 2010, Naoki Ishikawa.

* cited by examiner

*Primary Examiner* — Esaw Abraham
(74) *Attorney, Agent, or Firm* — Canon U.S.A., Inc. IP Division

(57) ABSTRACT

To suppress deterioration in image quality even if skew occurs during conveyance of a medium, an apparatus, which is configured to record on the medium conveyed in a direction that intersects an array direction of a plurality of recording elements using a recording head on which the recording elements are arranged, includes a table in which the recording elements are divided into a plurality of groups, and which includes correction information corresponding to the recording elements for each group, a first acquisition unit configured to acquire position information about the medium in the array direction, a second acquisition unit configured to acquire the correction information based on the position information and the table, and a correction unit configured to correct image data based on the correction information.

16 Claims, 14 Drawing Sheets

RECORDING APPARATUS FOR PERFORMING IMAGE PROCESSING FOR RECORDING ON A RECORDING MEDIUM BY RELATIVE MOVEMENT

CROSS REFERENCE TO RELATED APPLICATIONS

This application claims priority from Japanese Patent Application No. 2010-132129 filed Jun. 9, 2010, which is hereby incorporated by reference herein in its entirety.

BACKGROUND OF THE INVENTION

1. Field of the Invention

The present invention relates to a recording apparatus and a control method thereof. Especially, the present invention relates to image data processing.

2. Description of the Related Art

Japanese Patent Application Laid-Open No. 10-13674 discusses performing correction processing on image data when performing image recording using a recording head to control density unevenness produced due to differences in the ink amount discharged by each recording element.

However, as illustrated in FIG. 6, if skew occurs during conveyance of a recording medium, the positional relationship between the recording medium and the recording head (positional relationship in the array direction of the recording elements) changes. Consequently, correction of the image data becomes insufficient, so that the image quality is affected by the skew and deteriorates.

SUMMARY OF THE INVENTION

According to an aspect of the invention, an apparatus, which is configured to record on a medium conveyed in a direction that intersects an array direction of a plurality of recording elements using a recording head on which the recording elements are arranged, includes a table in which the recording elements are divided into a plurality of groups, and which includes correction information corresponding to the recording elements for each group, a first acquisition unit configured to acquire position information about the medium in the array direction, a second acquisition unit configured to acquire the correction information based on the position information and the table, and a correction unit configured to correct image data based on the correction information.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 3:
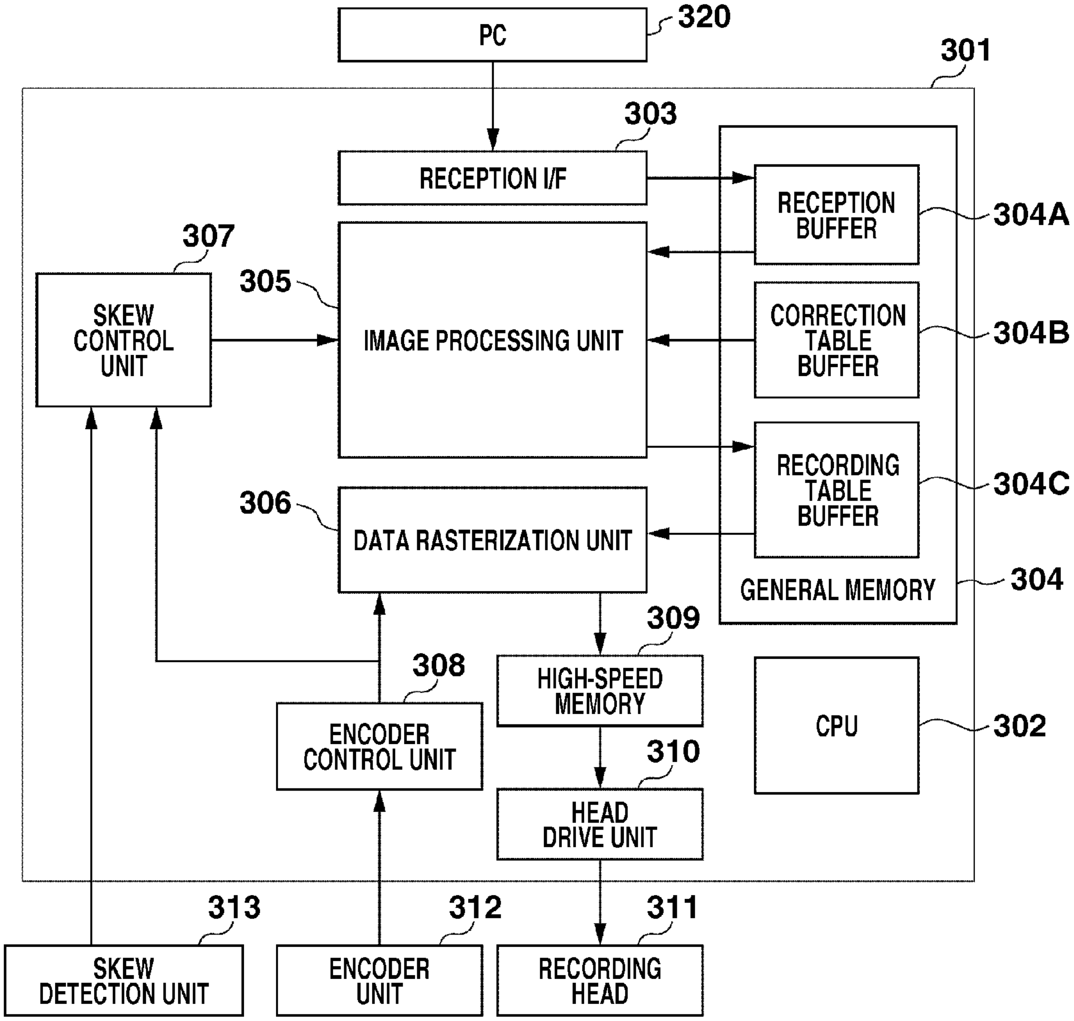
FIG. 3 illustrates a control configuration of a recording apparatus according to a first exemplary embodiment.

FIG. 3 illustrates a control configuration of an inkjet recording apparatus according to a first exemplary embodiment.

A central processing unit (CPU) 302 controls and manages the operations of an application-specific integrated circuit (ASIC) 301. A memory 304 is a synchronous dynamic random access memory (SDRAM) that acts as a main memory for the recording apparatus according to the present exemplary embodiment. The memory 304 is not limited to a SDRAM, and may be a DRAM or a static-RAM (SRAM).

A reception interface (I/F) 303 is an interface unit which receives data transferred from a host apparatus (PC) 320. This interface unit 303 loads a signal (data) based on an interface protocol such as universal serial bus (USB) and Institute of Electrical and Electronics Engineers (IEEE) 1394, and stores the loaded signal in a reception buffer 304A. Further, instead of receiving from the host apparatus (PC), the reception I/F 303 may be configured to receive data from an image reading unit.

Figure 4:
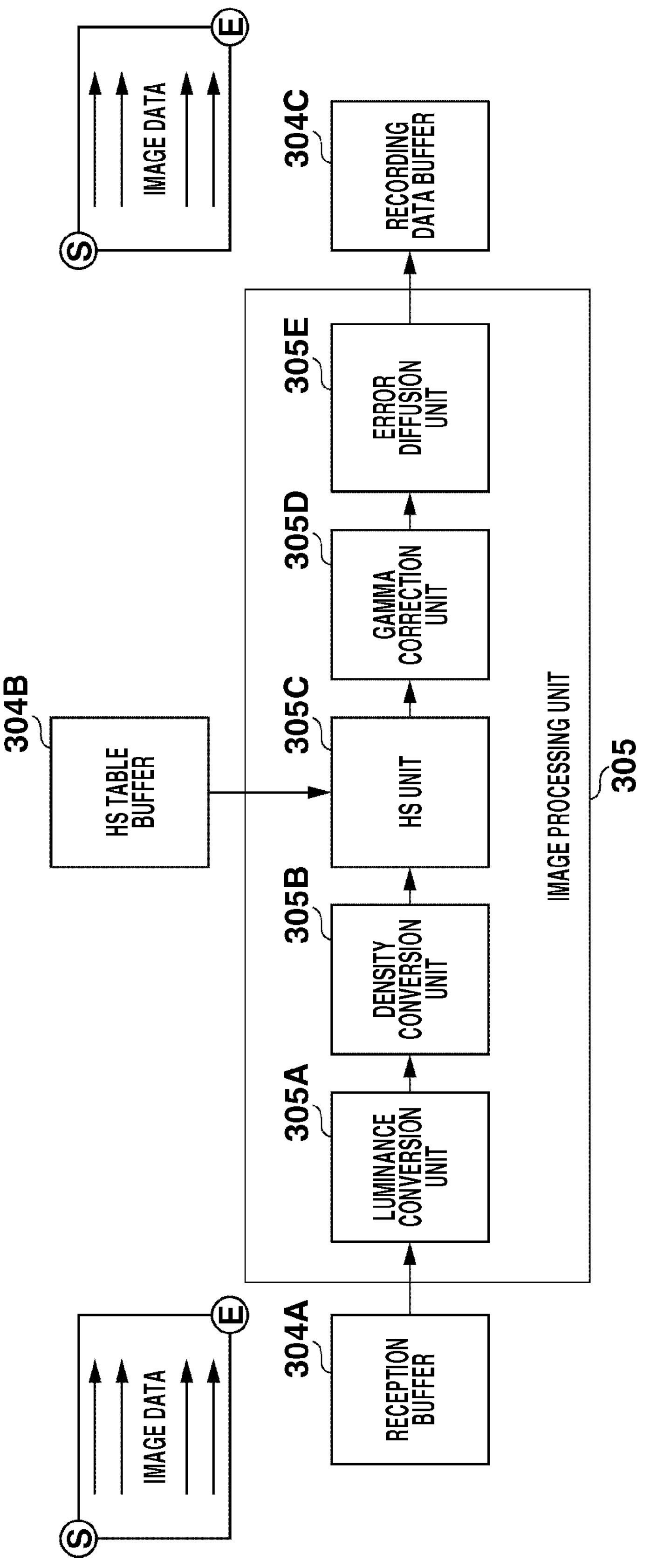
FIG. 4 illustrates an image processing unit according to a first exemplary embodiment.

Data stored in a reception buffer 1204 is read into an image processing unit 305. As illustrated in FIG. 4, the image processing unit 305 includes a luminance conversion unit 305A, a density conversion unit 305B, an HS unit 305C for performing HS processing (density correction), a gamma correction unit for performing gamma conversion, and an error diffusion unit 305E for performing error diffusion processing.

The image data illustrated in FIG. 4 represents image data formed from four rasters. The image processing unit 305 performs the above-described processing in order on this image data, and stores the resultant data in a recording data buffer 304C.

Figure 2A:
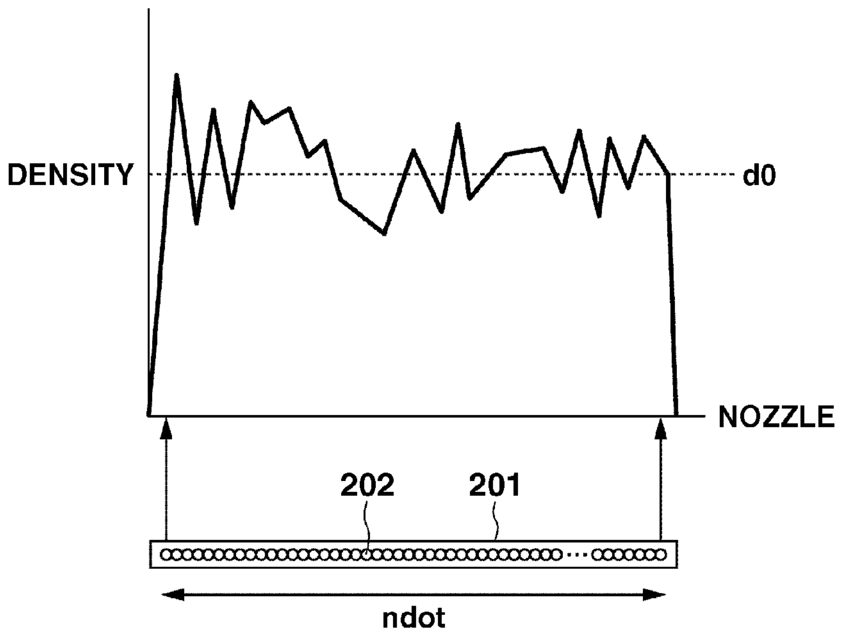
FIGS. 2A and 2B are supplementary diagrams illustrating a recording characteristic of a recording element and correction control.
Figure 2B:
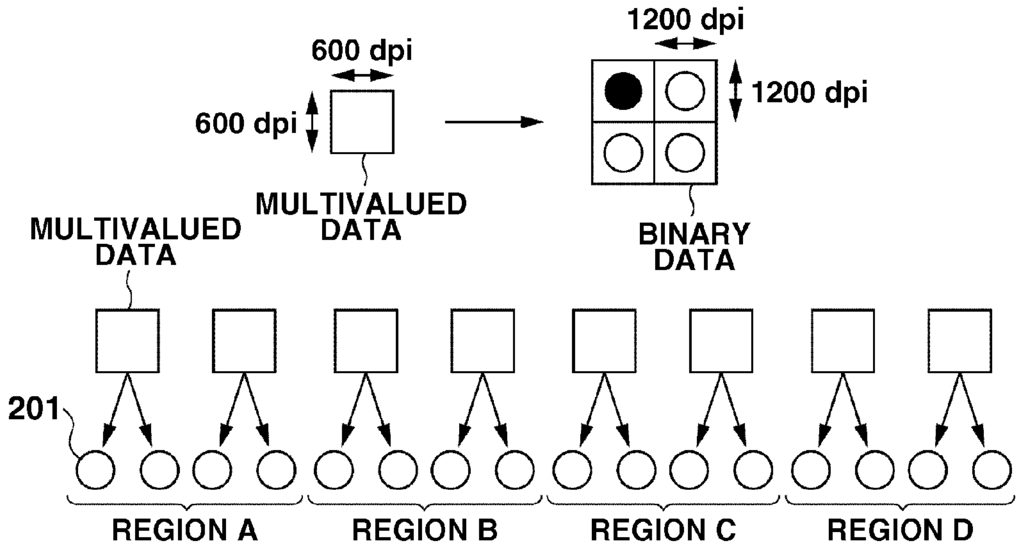

As illustrated in FIG. 2A, the density characteristic of recording elements 202 configuring a recording element array 201 is uneven for the respective recording elements. Accordingly, as illustrated in FIG. 2B, adjacent recording elements are divided into a plurality of regions (groups). Correction data (correction information) for each region (group) is stored in a correction table buffer 304B. HS processing specifies a recording element that the density data corresponds to, acquires the correction data corresponding to that recording element, and corrects a density value of the image data based on that correction data.

A skew detection unit 313 detects skew. A skew control unit (skew acquisition unit) 307 acquires a skew amount, skew direction and the like based on information from the skew detection unit 313. The skew control unit 307 outputs skew-related information to the image processing unit. If the skew-related information is a periodic value, it may be pre-stored in the memory, and read when performing the conveyance operation.

An encoder unit 312 outputs a signal based on an operation of a conveyance unit. An encoder control unit (encoder acquisition unit) 308 acquires speed information about the conveyance unit or the paper sheet (recording medium), and information about a drive amount (rotation amount and movement amount). This information is output to a data rasterization unit 306 and the skew control unit 307.

Data stored in the recording data buffer 304C is read into the data rasterization unit 306 based on a timing of a recording control. The data rasterization unit 306 performs various processes, such as data rasterization processing and mask control, and stores dot data in a memory 309. As illustrated in FIG. 2B, the data rasterization processing generates four pieces of 1,200 dpi dot data (binary data) based on one piece of 600 dpi multivalued data. four pieces of dot data comprises two pieces (lateral direction) and two pieces (longitudinal direction). The lateral direction is the array direction of the recording elements. The longitudinal direction is the conveyance direction. Therefore, two rasters of 1,200 dpi dot data are generated from one raster of 600 dpi multivalued data. Here, the black circles represent dots to be recorded, and the white dots represent dots that are not recorded.

The data rasterization unit 306 generates a timing signal for driving the recording head based on information and signals from the encoder control unit 308. A head drive unit 310 transfers the binary data stored in the memory 309 to a recording head 311 based on the timing signal generated by the data rasterization unit 306. The head drive unit 310 generates a signal for driving the recording elements included in the recording head 311, and outputs the generated signal to the recording head 311. The recording head 311 drives the recording elements based on the binary data, and discharges ink.

Figure 6:
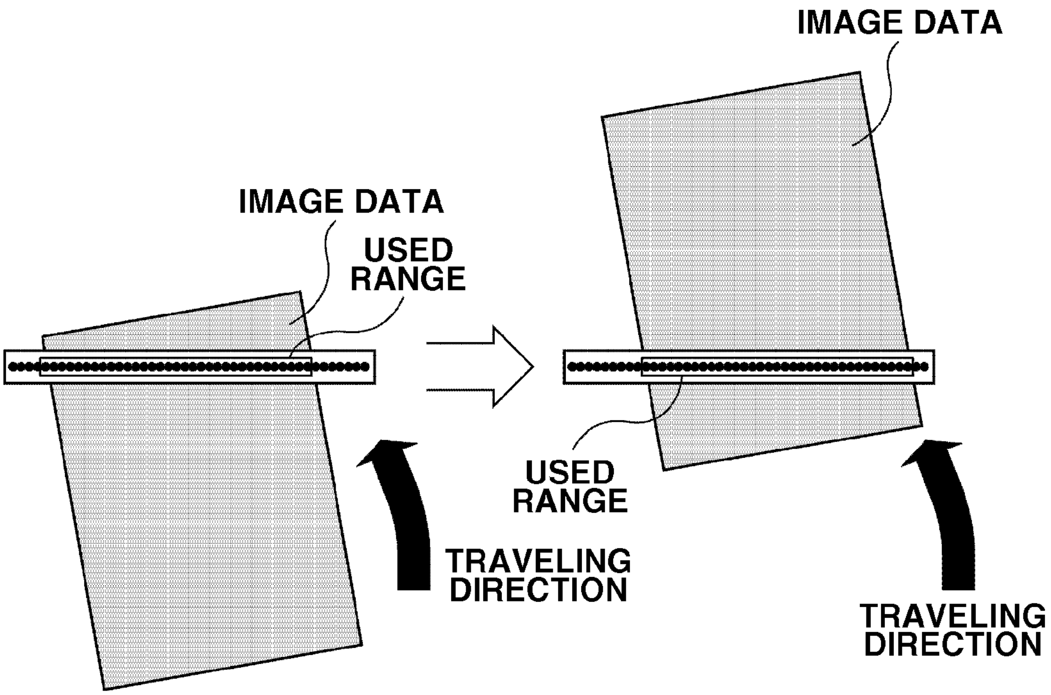
FIG. 6 illustrates a recording element used in recording when skew occurs.

Next, the HS processing will be described. As illustrated in FIG. 6, when skew occurs and the positional relationship between the recording elements and the paper sheet changes, the recording elements used in recording similarly change. Consequently, image data density correction is performed for the recording elements used in recording.

Figure 1A:
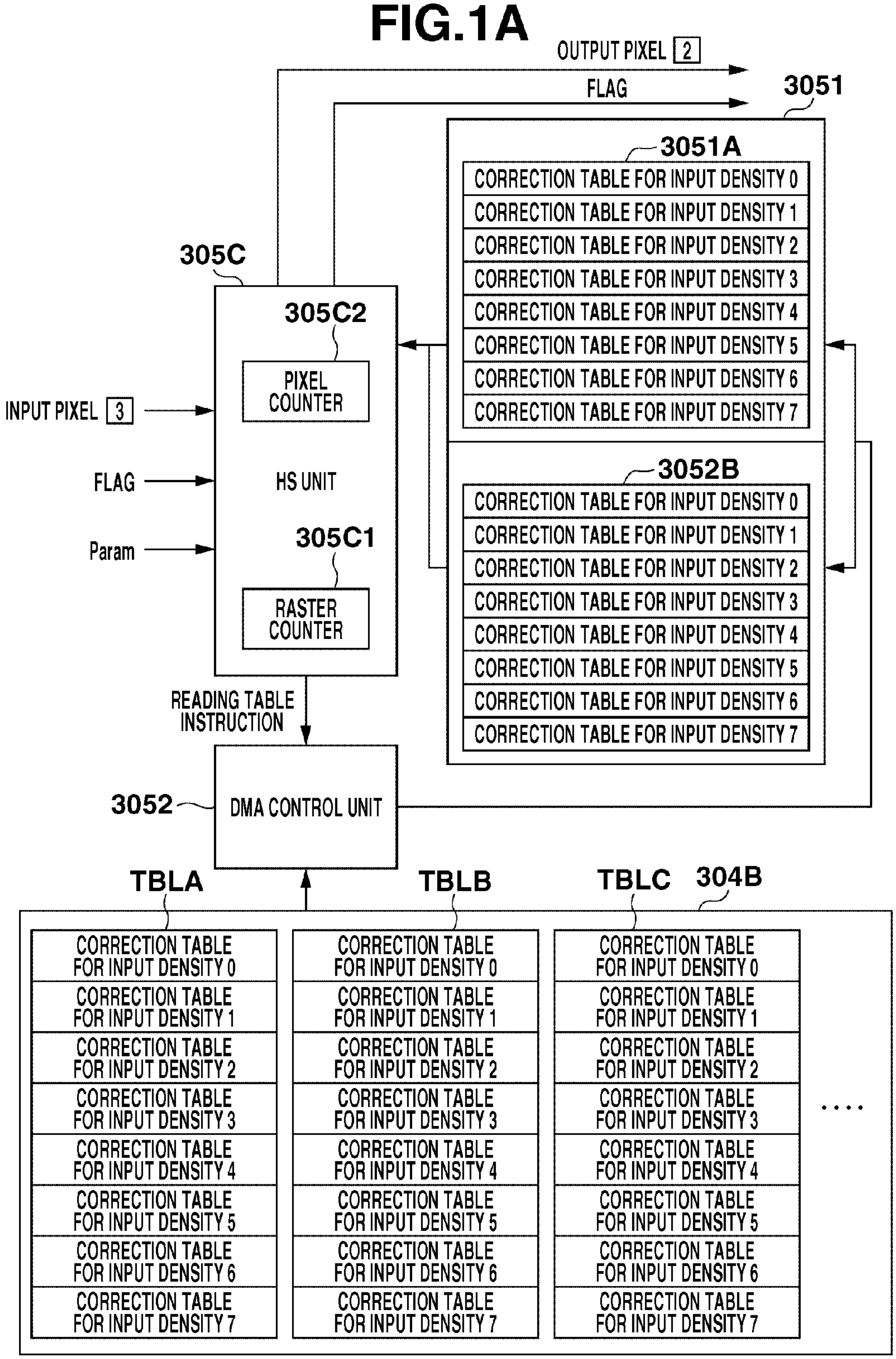
FIGS. 1A and 1B illustrate a correction unit according to a first exemplary embodiment.
Figure 1B:
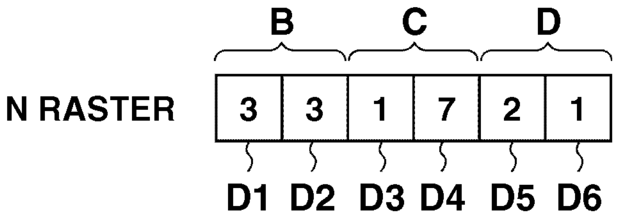

FIGS. 1A and 1B illustrate HS processing control. FIG. 1A illustrates a configuration for density correction of the HS unit (density correction unit) 305C.

As illustrated in FIG. 2B, a plurality of recording elements are arranged on the recording head. These recording elements are formed into regions obtained by dividing the recording elements into a predetermined number. Here, to simplify the description, 16 recording elements (201) form four groups (regions) from A to D. One group is configured from two pixels of multivalued data, and four recording elements.

Correction tables (TBLA, TBLB, TBLC, . . . ) corresponding to the recording element groups (regions) are stored in the correction table buffer 304B illustrated in FIG. 1. These correction tables include correction values for each density level, and respectively include correction values corresponding to two recording elements (one piece of multivalued data). As illustrated in FIG. 2B, each pixel data is corrected based on the corresponding correction data, then rasterized into binary data, and assigned to a recording element. To reduce the size of the correction tables, the correction values may be shared among the regions.

In this exemplary embodiment, to simplify the description, the density range of the image data is set from a density of 0 to 7, and includes correction values corresponding to each density.

The correction table buffer 304B is for example, a DRAM. Further, a buffer 3051 (e.g. an SRAM) capable of high-speed writing from the correction table buffer 304B includes regions 3051A and 3051B storing two correction tables. This enables writing of a correction table in one region while performing reading from a correction table in another region. The HS unit alternately accesses the correction data from one region each time reading is performed.

A direct memory access (DMA) control unit 3052 transfers a correction table from the correction table buffer 304B to a buffer 3051 based on an instruction from the HS unit 305C. The DMA control unit 3052 is a data transfer control unit. The HS unit 305C outputs an instruction when the correction processing of one region finishes.

Next, input and output of the data into/from the HS unit 305C will be described. As illustrated in FIG. 1B, for example, the processing of data of one raster formed from 6 pixels (D1 to D6) will be described. Here, the data formed from 6 pixels is assigned to regions B to D based on information about the skew amount. Consequently, the correction table uses TBLB, TBLC, and TBLD. The selection tables TBLB, TBLC, and TBLD are stored in the buffer 3051 in advance.

For example, as illustrated in FIG. 1B, if the data (density 3) for a first pixel of N raster is the first pixel of group B, the correction table with a density 3 in the correction table (TBLB) is selected, and the correction value for the first pixel in that table is selected. The input pixel is corrected based on this correction value. Since this correction value is −1, as illustrated in FIG. 1A, the value of the output pixel is calculated by subtracting a correction value of 1 from the input pixel value 3. The value of the output pixel is thus 2. Subsequently, correction is performed for each pixel one-by-one in order, and the corrected values are output. After performing the correction processing for 6 pixels, the processing for the next N+1 raster is similarly performed.

The HS unit 305C includes a raster counter 305C1 for managing the raster number. The HS unit 305C inputs image data, flag information (FLAG) indicating whether a pixel is the last pixel data of a raster, and parameter information (Param) from the density conversion unit 305B, which is at a previous stage of a pixel counter 305C2 count for managing the pixel number. The parameter information includes information, such as skew amount, for selecting the correction table. The HS unit 305C acquires position information about the sheet concerning the array direction of the recording elements based on this parameter information, and performs setting for the correction processing. For example, the HS unit 305C sets the range of the recording elements to be used among the recording element array, to the register of the HS unit 305C.

If the flag information is valid (flag information is set), specifically, if the flag information indicates the last pixel of the raster, the HS unit recognizes that the pixel data for the next raster is to be processed, and adds 1 to the raster counter. The raster counter is reset to zero before starting the processing of one piece of image data.

Based on the above configuration and initial setting, the processing is started by the image processing unit 305.

The HS unit 305C inputs the processed input pixel information and flag information indicating whether the pixel is the last pixel of the raster, from the density conversion unit 305B, which is a previous unit, and performs the above-described processing.

Figure 5B:
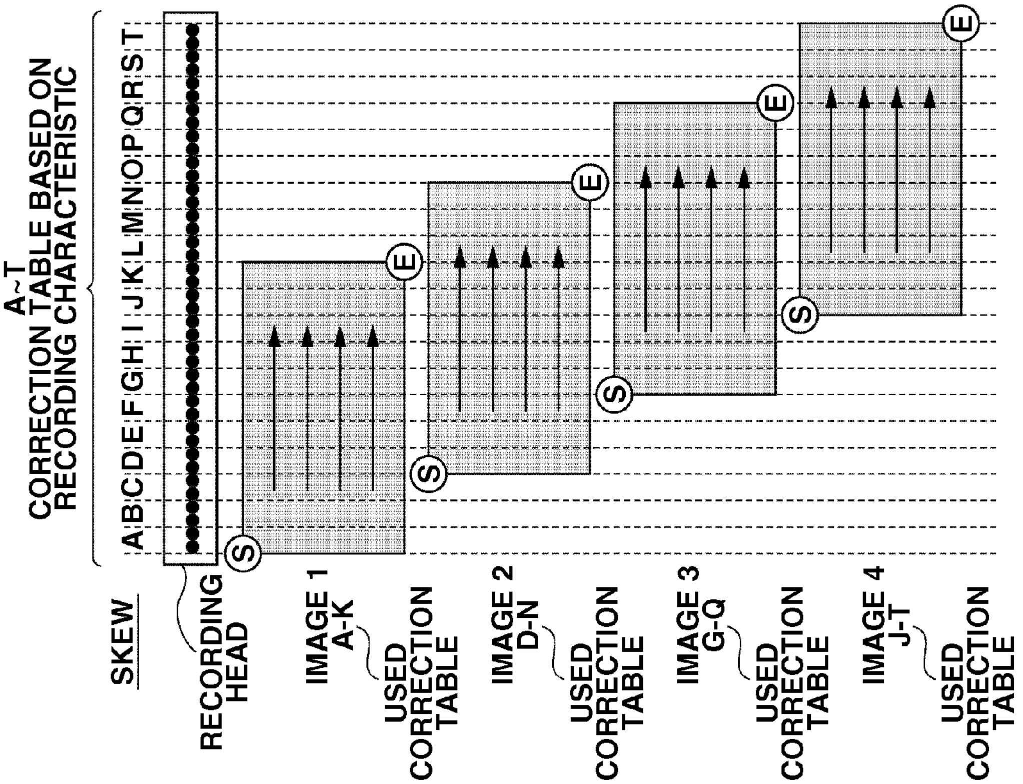
FIGS. 5A and 5B illustrate use of a correction table based on the presence of skew according to a first exemplary embodiment.
Figure 5A:
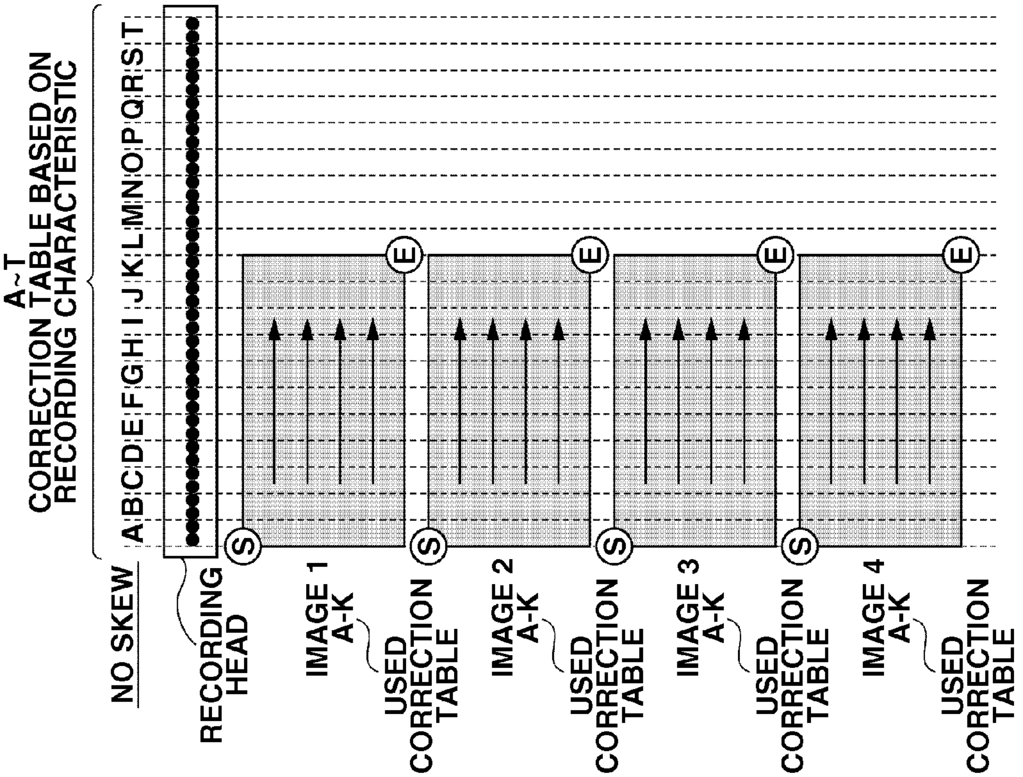

FIG. 5A illustrates from the recording of image 1 to the processing of image 4 when skew does not occur. To simplify the description, images 1, 2, 3, and 4 are all formed from four rasters.

The image 1 will now be described. Processing is performed in order in the arrow direction from a pixel S, which is the leading pixel in the first raster. Specifically, processing is performed in order from region A to region K. When the processing of the first raster is finished, the processing of the next raster is performed in order from region A to region K. The final pixel in the last raster is the pixel E.

In FIG. 5A, since skew does not occur, the relative positional relationship between the recording head and the recording medium is constant, without change from the recording of pixel 1 to the recording of pixel 4. Therefore, the regions (A to K) where the HS unit performs processing for recording are the same, so that the HS unit uses the correction tables corresponding to regions A to K.

FIG. 5B illustrates from the recording of image 1 to the processing of image 4 when skew has occurred. Since skew has occurred, the relative positional relationship between the recording head and the recording medium changes from the recording of image 1 to the recording of image 4. Therefore, the recording elements to which the image for recording is assigned also change. For example, for image 1, the leading pixel (pixel S) is the first pixel of region A, and in image 2, the leading pixel is the first pixel of region D.

Thus, the HS unit performs correction processing by selecting the table to be referenced based on skew information included in the input parameter information (Param), and referencing the selected table.

Based on the above configuration, high-speed processing capable of handling the increased capacity of correction tables can be realized while suppressing increases in circuit size. Further, image unevenness can be reduced even when skew occurs during conveyance of the recording medium.

Figure 12:
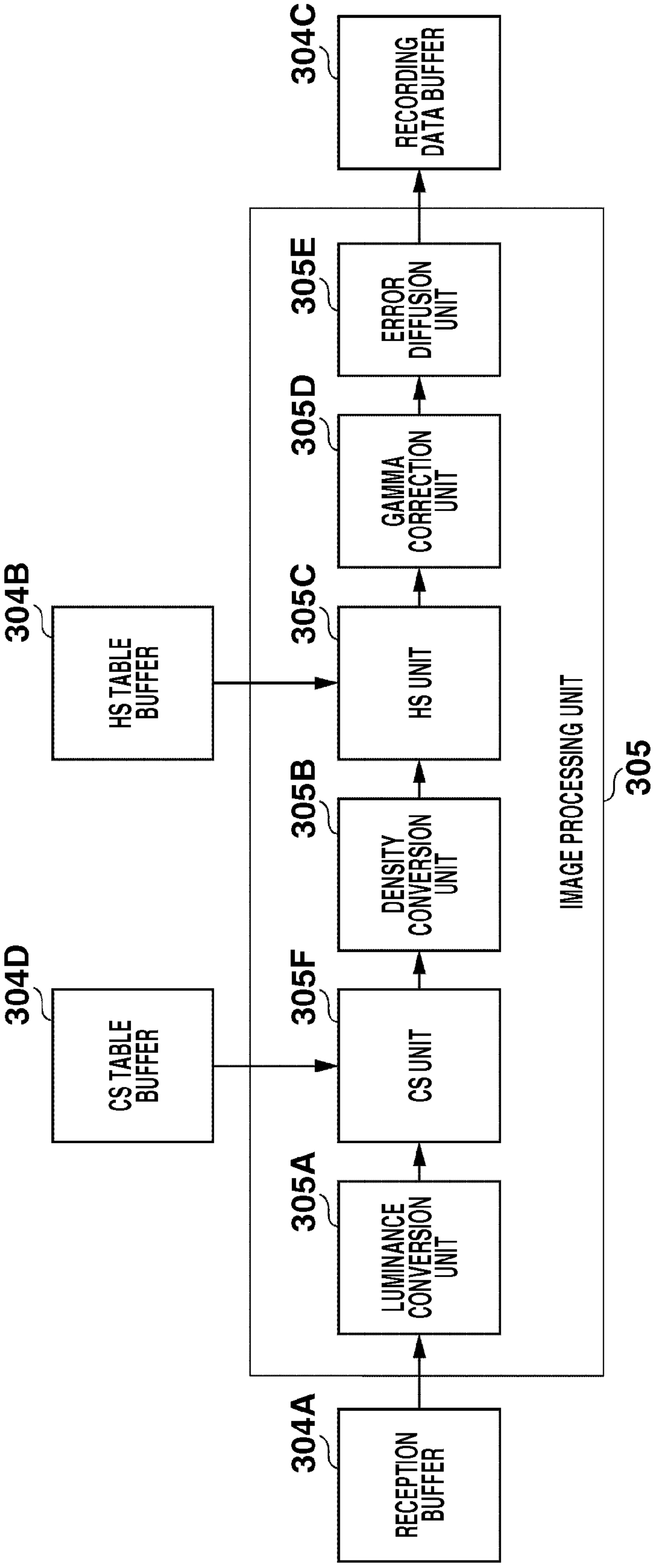
FIG. 12 illustrates an image processing unit according to a second exemplary embodiment.
Figure 13:
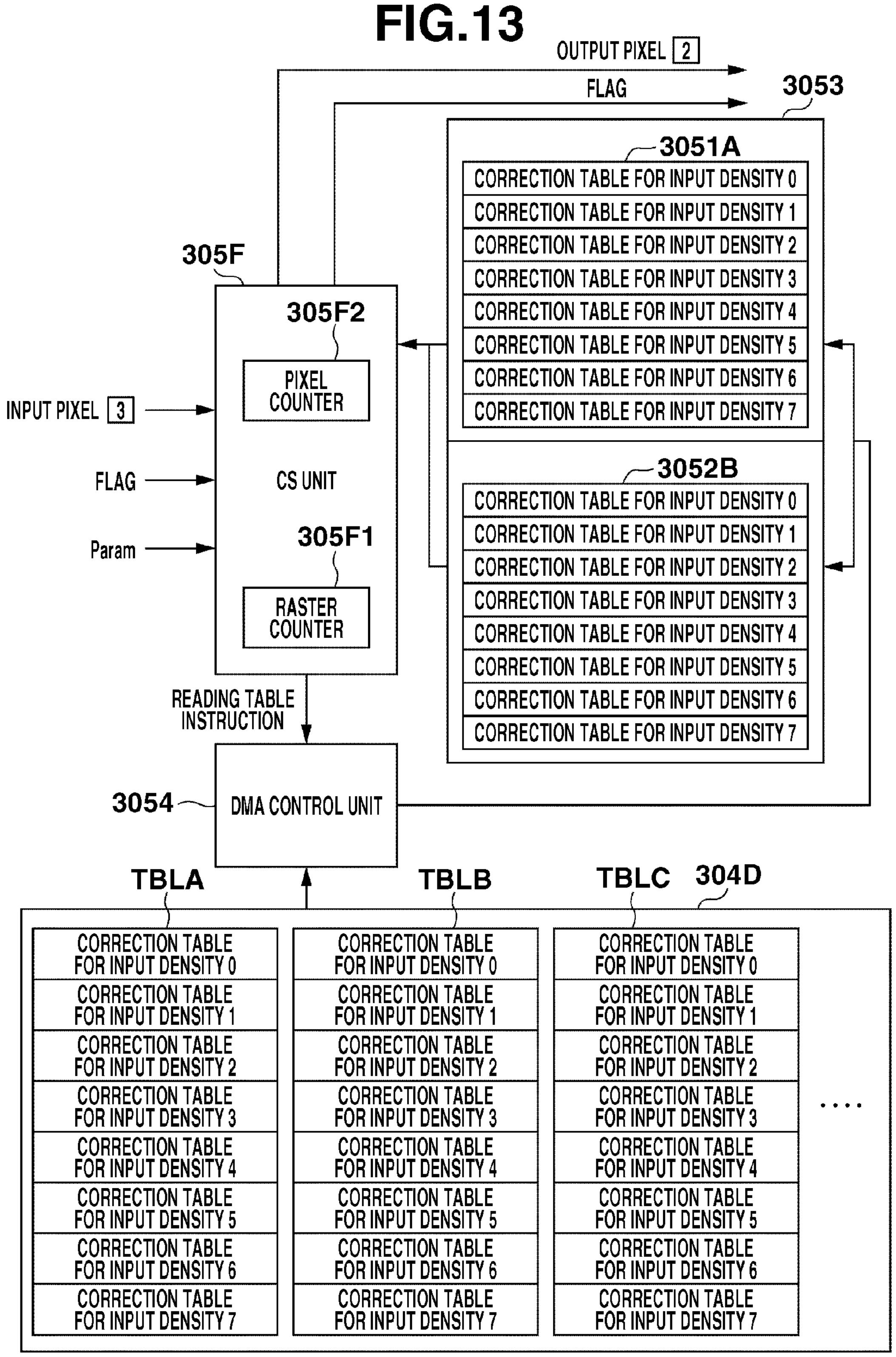
FIG. 13 illustrates a correction unit according to a second exemplary embodiment.

In a second exemplary embodiment, a configuration for luminance correction performed by a CS unit (luminance correction unit) 305F in the image processing unit 305 will be described. FIG. 12 illustrates the image processing unit 305. The differences with the first exemplary embodiment will be described. The luminance conversion unit 305A, which is provided at an earlier stage than the CS unit (luminance correction unit) 305F converts sRGB data, which are the represented colors on a monitor, into color reproduction range data RGB for a printer. The luminance conversion unit 305A performs conversion processing using a three-dimensional look-up table (LUT). The CS unit 305F corrects luminance information based on skew in a similar manner to the first exemplary embodiment. The CS unit 305F performs correction using the three-dimensional LUT so that color differences can be reduced even if there are differences in the discharge characteristic of the recording elements. FIG. 13 illustrates a configuration of the CS unit. Correction tables (TBLA, TBLB, TBLC, . . . ) corresponding to the recording element groups (regions) are stored in a correction table buffer 304D illustrated in FIG. 13. This correction table buffer 304D is provided in the memory 304 illustrated in FIG. 3. The correction tables include correction values for each luminance level, and respectively include correction values corresponding to two recording elements (one piece of multivalued data). In the second exemplary embodiment, to simplify the description, the luminance range of the image data is set from a luminance of 0 to 7 and includes correction values corresponding to each luminance. Further, similar to the first exemplary embodiment, a buffer 3053 (e.g. an SRAM) capable of high-speed writing includes a region storing two correction tables.

(Printer Configuration)

Next, an exemplary embodiment of the recording apparatus (printer) using an inkjet system applied to the first and second exemplary embodiments will be described. The printer is an inkjet printer that uses a continuous sheet wound in a roll shape that can handle both one-sided and two-sided printing.

Figure 7:
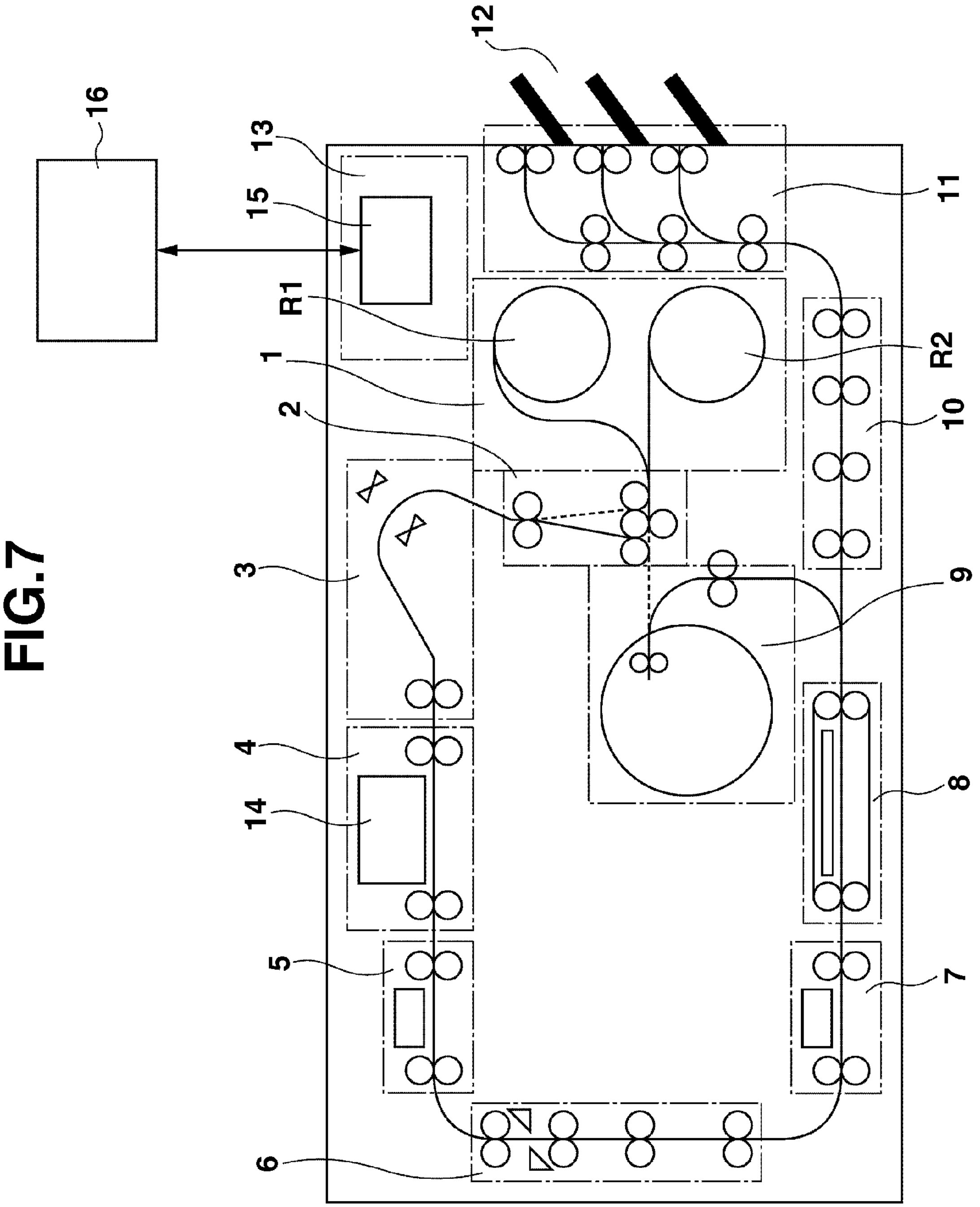
FIG. 7 is a cross-sectional view of a recording apparatus.

FIG. 7 is a schematic diagram of a cross section of a printer. Broadly speaking, the inside of the printer includes units such as a sheet feeding unit 1, a decurling unit 2, a skew correction unit 3, a print unit 4, an inspection unit 5, a cutter unit 6, an information recording unit 7, a drying unit 8, a sheet winding unit 9, a discharge conveyance unit 10, a sorter unit 11, a discharge tray 12, and a control unit 13. A sheet is conveyed by a conveyance mechanism configured from a pair of rollers and a belt along a sheet conveyance path illustrated by a solid line in FIG. 7, and is processed by the respective units.

The sheet feeding unit 1 is a unit for storing and feeding a continuous sheet wound in a roll shape. The sheet feeding unit 1 can store two rolls R1 and R2, and alternatively pick up and feed these sheets. The number of rolls that can be stored is not limited to two. The sheet feeding unit 1 may be configured to store one roll or three or more rolls. The decurling unit 2 is a unit for reducing curl (curvature) of the sheet fed from the sheet feeding unit 1. In the decurling unit 2, curling is reduced by curving and squeezing the sheet so as to apply the opposite curvature to the curl by using two pinch rollers for one drive roller. The skew correction unit 3 is a unit for correcting skew (skew with respect to the original travelling direction) of the sheet which has passed the decurling unit 2. The skew of the sheet is corrected by pressing the sheet edge on a reference side against a guide member.

The print unit 4 is a unit for forming an image by a print head 14 on the sheet being conveyed. The print unit 4 includes a plurality of conveyance rollers for conveying the sheet. The print head 14 has line type print heads on which an inkjet nozzle array is formed over a range that covers the maximum width of the sheets which are expected to be used. In the print head 14, the plurality of print heads is arranged in parallel in the direction of sheet conveyance. In the present example, seven print heads are provided, corresponding to C (cyan), M (magenta), Y (yellow), LC (light cyan), LM (light magenta), G (gray), and K (black). As illustrated in FIG. 2, a plurality of recording elements is arranged on the print heads. The array direction thereof is orthogonal to the conveyance direction of the recording medium. Further, the number of colors and print heads is not limited to seven. Examples of the inkjet method that can be employed include a method using a heater element, a method using a piezo element, and a method using a microelectromechanical systems (MEMS) element. The ink for each color is supplied to the print head 14 via respective ink tubes from an ink tank. The skew detection unit 313 described using FIG. 3 is provided on an upstream side in the conveyance direction and on a downstream side in the conveyance direction of the print head 14. The skew detection unit 313 detects the edge in the conveyance direction of the recording medium with an optical line sensor. The skew detection unit 313 can acquire information about the meander and skew of the recording medium by periodically inputting a signal from the line sensor and performing processing.

The inspection unit 5 is a unit for inspecting a print head nozzle state, a sheet conveyance state, an image position and the like, by optically reading an inspection pattern and the image printed on the sheet by the print unit 4. The cutter unit 6 includes a mechanical cutter which cuts the printed sheet to a predetermined length. The cutter unit 6 also includes a plurality of conveyance rollers for feeding the sheet to the next step. The information recording unit 7 is a unit for recording print information such as a print serial number and the date on a rear surface of the cut sheet. The drying unit 8 is a unit for drying the applied ink in a short period of time by heating the sheet printed by the print unit 4. The drying unit 8 also includes a conveyance belt and a conveyance roller for feeding the sheet onto the next step.

The sheet winding unit (sheet reverse unit, reverse unit) 9 is a unit for temporarily winding up the continuous sheet for which front surface printing has finished when performing two-sided printing. The sheet winding unit 9 includes a rotating wind drum for winding up the sheet. A continuous sheet for which front surface printing has finished but which has not yet been cut is temporarily wound up on the wind drum. When winding up is finished, the wind drum is rotated in reverse, and the wound-up sheet is fed to the decurling unit 2, and sent to the print unit 4. Thus, since the front and rear surfaces of the sheet have been reversed by the winding unit (sheet reverse unit) 9, printing can be performed on the rear surface by the print unit 4. The two-sided print operation will be described in more detail below.

The discharge conveyance unit 10 is a unit for conveying the sheet cut by the cutter unit 6 and dried by the drying unit 8, and transferring the sheet to the sorter unit 11. The sorter unit 11 is a unit which sorts the printed sheets into different trays of the discharge tray 12 for each group as necessary. The control unit 13 controls each of the units in the whole printer. The control unit 13 has a power source and a controller 15, which includes the above-described CPU, ASIC or similar control circuit, memory, and various I/O interfaces. The printer operations are controlled based on a command from the controller 15, or based on a command from an external device 16, such as a host computer, which is connected to the controller 15 via an I/O interface.

Next, the recording operation will be described. Since the operation is different for one-sided and two-sided printing, both of these operations will be described.

Figure 8:
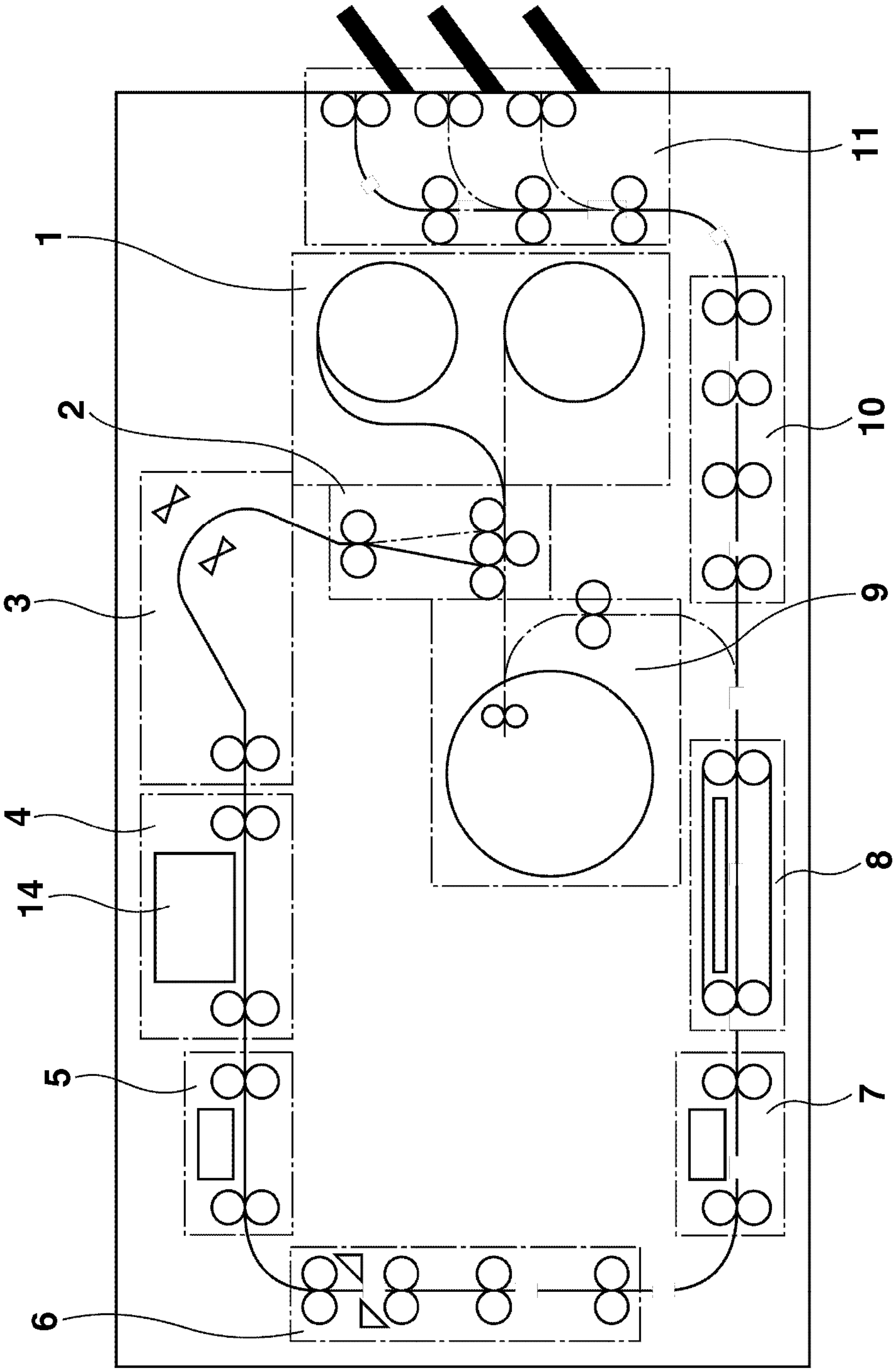
FIG. 8 illustrates conveyance performed in a recording apparatus.

FIG. 8 illustrates the operations performed during one-sided printing. The conveyance path until the sheet fed from the sheet feeding unit 1 is printed and discharged to the discharge tray 12 is illustrated in a thick line. A sheet is fed from the sheet feeding unit 1 and then processed by the decurling unit 2 and the skew correction unit 3 respectively. This sheet is then printed on its surface by the print unit 4. The printed sheet passes through the inspection unit 5, and is cut into pre-set lengths of a predetermined unit by the cutter unit 6. Print information is recorded on the rear surface of the cut sheet as necessary by the information recording unit 7. Then, each of the cut sheets is conveyed to the drying unit 8 and dried. Subsequently, the sheets pass through the discharge conveyance unit 10, and are successively discharged and loaded onto the tray 12 of the sorter unit 11.

Figure 9:
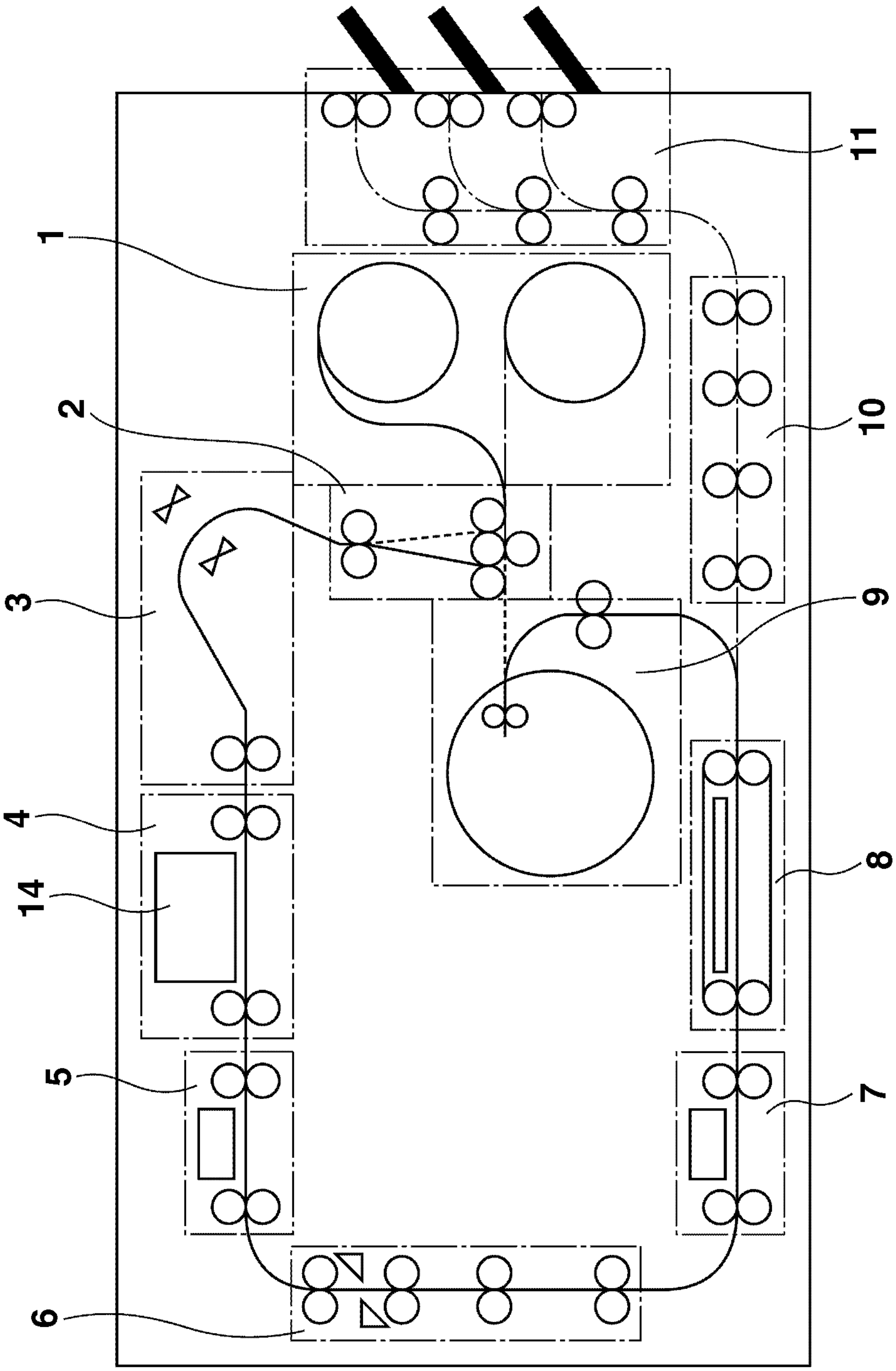
FIG. 9 illustrates conveyance performed in a recording apparatus.

FIG. 9 illustrates the operations performed during two-sided printing. In two-sided printing, a rear surface print sequence is performed following the front surface print sequence. In the initial front surface print sequence, the operations by each unit from the sheet feeding unit 1 to the inspection unit 5 are the same as the operations for above-described one-sided printing. However, the continuous sheet is conveyed to the drying unit 8 without performing the cutting operation by the cutter unit 6. After the ink on the front surface is dried by the drying unit 8, the sheet is introduced into a path on the sheet winding unit 9 side, instead of a path on the discharge conveyance unit 10 side. The introduced sheet is wound up onto the wind drum of the sheet winding unit 9 rotating in the traveling direction (in FIG. 9, an anti-clockwise direction). At the print unit 4, when all of the planned printing of the front surface is finished, the trailing edge of the print region of the continuous sheet is cut by the cutter unit 6. Based on the cut position, the continuous sheet on the downstream side in the conveyance direction (printed side) passes through the drying unit 8, and all of the continuous sheet up to the sheet trailing edge is wound up by the sheet winding unit 9. On the other hand, the continuous sheet further on the downstream side in the conveyance direction from the cut position is wound back to the sheet feeding unit 1 so that the sheet leading edge (cut position) does not remain on the decurling unit 2.

After this front surface print sequence, the operation switches to the rear surface print sequence. The wind drum of the sheet winding unit 9 is rotated in the reverse direction opposite to the direction during the winding up (in FIG. 9, the clockwise direction). The edge of the wound-up sheet (the trailing edge of the sheet during winding up becomes the leading edge of the sheet during sheet feeding) is fed to the decurling unit 2. At the decurling unit 2, curling correction in the opposite direction to the previous direction is performed. This is because the sheet wound on the wind drum is wound with its front and rear surfaces reversed from the roll at the sheet feeding unit 1, so that the curl faces the opposite direction. Then, the sheet passes through the skew correction unit 3, and printing is performed on the rear surface of the continuous sheet by the print unit 4. The printed sheet then passes through the inspection unit 5, and is cut into pre-set lengths of a predetermined unit by the cutter unit 6. Since the cut sheet has been printed on both sides, recording is not performed in the information recording unit 7. The cut sheets are each conveyed to the drying unit 8, passed through the discharge conveyance unit 10, and are successively discharged and loaded onto the tray 12 of the sorter unit 11.

Other Exemplary Embodiments

While exemplary embodiments were described above, the present invention is not limited to the numbers in the embodiments described above. Further, for example, although the HS unit and the CS unit were described as the image correction unit, the present invention may also be applied to other correction processing.

For example, the number of recording elements included in the recording element array is not limited to 16 or 40. The number of recording element groups is not limited to 4 or 20 either. The number of recording elements constituting a group is not limited to 4, and may be, for example, a value such as 16 or 32.

Concerning the density level of the image data too, although the above exemplary embodiment was described with 8 density levels of 0 to 7, the present invention is not limited to those values. The number of density levels may be 128 or 256 levels. Moreover, although processing of image data of four rasters was described in the above exemplary embodiment, the present invention is not limited to this value.

Further, in the configuration illustrated in FIG. 1, although two regions were provided in the buffer 3051, i.e., a writing region and a reading region, the present invention may also be applied to a configuration that places priority on reducing memory capacity and has only one region.

Figure 10A:
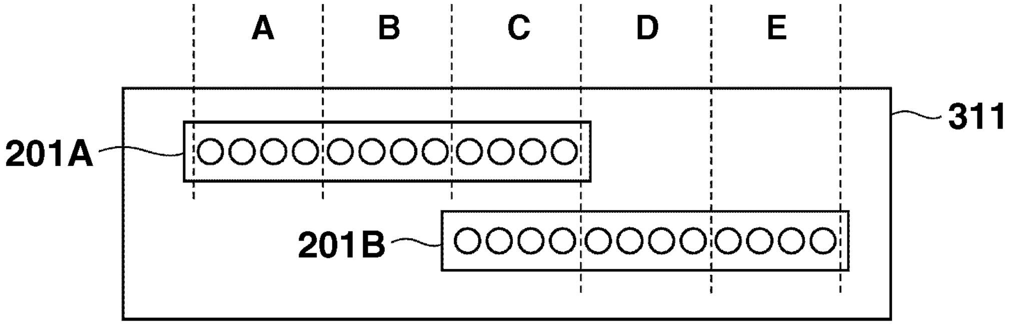
FIGS. 10A and 10B illustrate a recording head according to another exemplary embodiment.
Figure 10B:
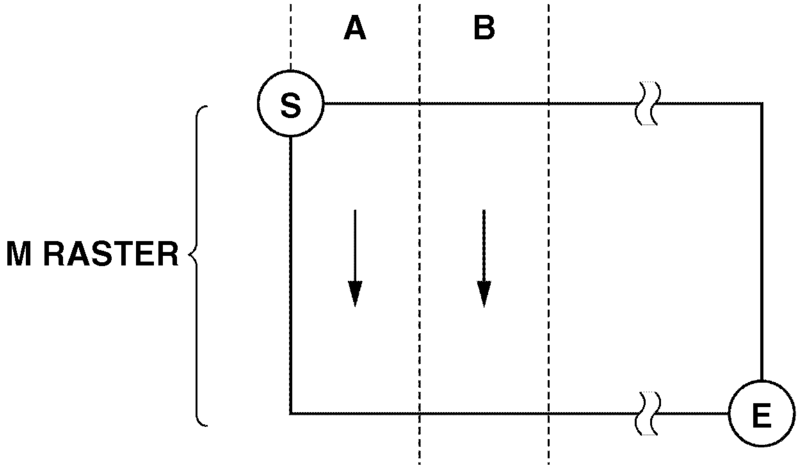

In addition, concerning the configuration of the recording head, for example, as illustrated in FIG. 10A, the recording head 311 may include recording element arrays 201A and 201B. In this case, the regions are assigned as illustrated in FIG. 10.

Moreover, in the above-described exemplary embodiment, concerning the order of the HS processing, the processing was performed in order of the regions in the raster. However, the processing may also be performed by performing processing for each identical region (each identical group) in order of those regions in such a manner that, as illustrated by the arrow in FIG. 10B, first, an M raster (plurality of rasters) region for the A region is processed, and then a B region is similarly processed.

Figure 11:
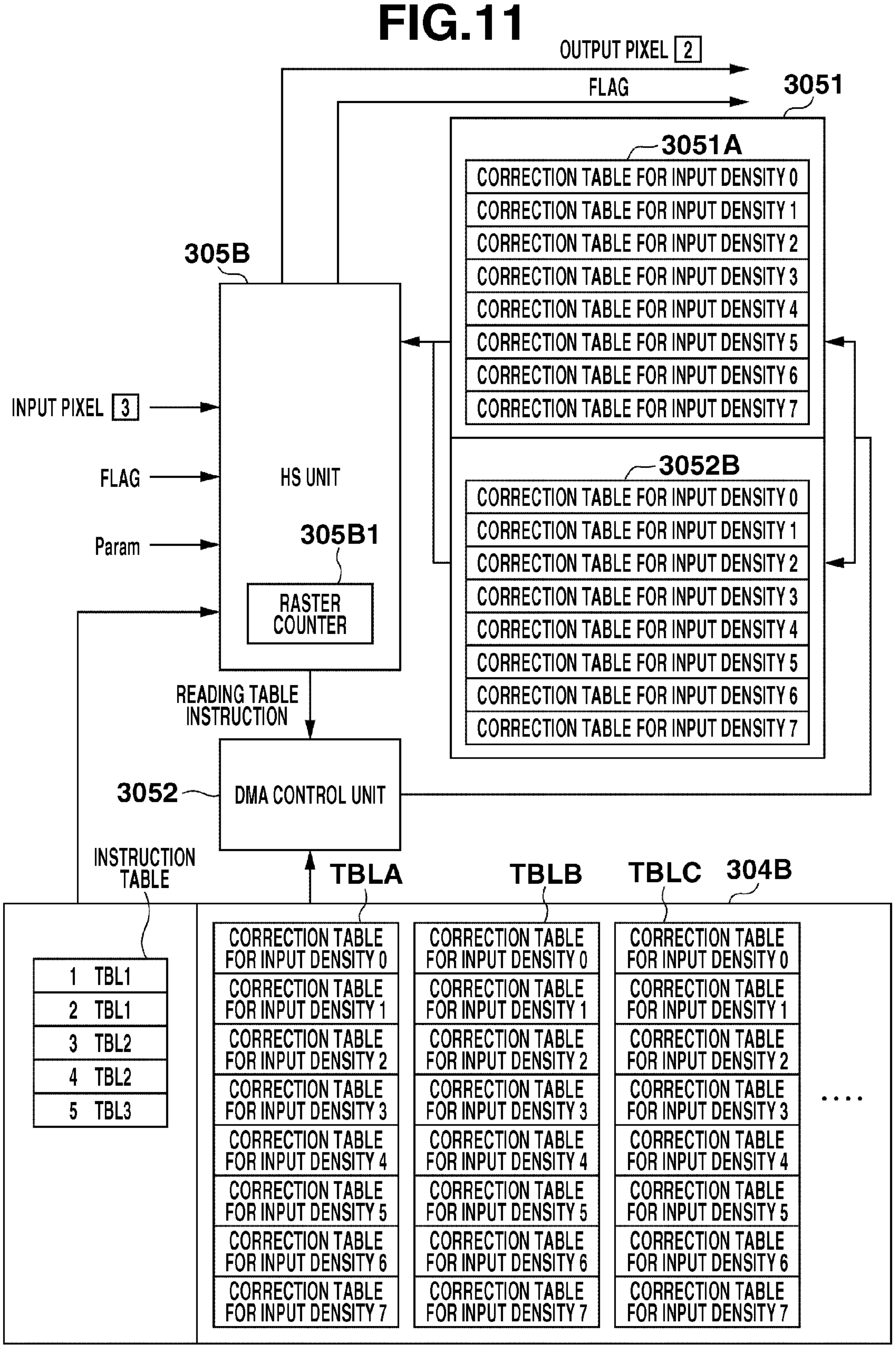
FIG. 11 illustrates an HS unit according to another exemplary embodiment.

The configuration of the table in the HS processing may be a common configuration using common tables (TBL1, TBL2, TBL3). The correction table buffer 304B illustrated in FIG. 11 includes an instruction table in addition to the correction table. This instruction table is provided such that one table is shared by the tables for a plurality of regions. The HS unit can perform HS processing by using a number of tables that is smaller than the number of regions by referencing this instruction table. Based on this configuration, the memory capacity of the correction table buffer 304B can be reduced.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. An apparatus to perform image processing for recording on a recording medium by relative movement of a recording head having a plurality of recording elements and the recording medium in a direction that intersects an array direction of the recording elements, the apparatus comprising:

a first acquisition unit configured to acquire skew information about skew of the recording medium with respect to the array direction of the plurality of recording elements;

a specifying unit configured to specify recording elements to be used for recording image data from among the plurality of recording elements based on the skew information acquired by a first acquisition unit;

a second acquisition unit configured to acquire correction information corresponding to the specified recording elements specified by the specifying unit; and a correction unit configured to correct image data based on the correction information acquired by the second acquisition unit.

2. The apparatus according to claim 1, wherein the correction unit is a density correction unit configured to perform density correction.

3. The apparatus according to claim 1, wherein the correction unit is a luminance correction unit configured to perform luminance correction.

4. The apparatus according to claim 1, wherein the recording elements to be used for recording from among the plurality of recording elements change in accordance with an amount of skew of the skew information acquired by the first acquisition unit.

5. The apparatus according to claim 1, wherein the correction information acquired by the second acquisition unit is different in each raster or each group of a predetermined number of rasters in accordance with the amount of skew of the skew information acquired by the first acquisition unit.

6. The apparatus according to claim 1, wherein the correction information is set for each recording element in accordance with a recording characteristic of each recording element.

7. The apparatus according to claim 1, wherein the plurality of recording elements are divided into a plurality of groups, the specifying unit specifies one or more group to be used for recording image data, and the correction information is set for each group in accordance with a recording characteristic of each recording element.

8. The apparatus according to claim 1, wherein the plurality of recording elements are divided into a plurality of groups, the specifying unit specifies a group to be used for recording image data, the apparatus further comprises a third acquisition unit configured to acquire specifying information for specifying one or more correction table corresponding to the group specified by the specifying unit, and the second acquisition unit acquires the correction table corresponding to the group specified by the specifying unit from among a plurality of correction tables based on the specifying information acquired by the third acquisition unit.

9. The apparatus according to claim 1, wherein the correction information specifies an amount of correction corresponding to each density level of the image data.

10. The apparatus according to claim 1, wherein the correction information specifies an amount of correction corresponding to each luminance level of the image data.

11. The apparatus according to claim 1, further comprising a detecting unit configured to detect an amount of skew of the recording medium with respect to the array direction of the recording elements, wherein the first acquisition unit acquires the amount of skew detected by the detecting unit as the skew information.

12. The apparatus according to claim 1, wherein the correction unit corrects the image date in each group in a case where the image data is divided into a plurality of groups in the array direction of the recording elements.

13. A method comprising:

recording on a recording medium by relative movement of a recording head having a plurality of recording elements and the recording medium in a direction that intersects an array direction of the recording elements;

acquiring skew information about skew of the recording medium with respect to the array direction of the plurality of recording elements;

specifying recording elements to be used for recording image data from among the plurality of recording elements based on the acquired skew information;

acquiring correction information corresponding to the specified recording elements specified by the specifying; and correcting image data based on the acquired correction information.

14. The method according to claim 13, further comprising performing density correction to correct image data.

15. The method according to claim 13, further comprising performing luminance correction to correct image data.

16. The apparatus according to claim 7, wherein the correction information is a correction table corresponding to each group.

* * * * *